United States Patent [19]
Ohta

[11] Patent Number: 5,202,722
[45] Date of Patent: Apr. 13, 1993

[54] IMAGE-FORMING SYSTEM

[75] Inventor: Mitsuru Ohta, Nagoya, Japan

[73] Assignee: Brother Kogyo Kabushiki Kaisha, Nagoya, Japan

[21] Appl. No.: 863,232

[22] Filed: Apr. 3, 1992

[30] Foreign Application Priority Data

Apr. 17, 1991 [JP] Japan .................. 3-85289

[51] Int. Cl.⁵ .......................................... G03B 27/32
[52] U.S. Cl. ...................................... 355/27; 355/210; 355/211; 355/271; 430/138
[58] Field of Search ............ 355/27, 32, 35, 271, 355/210, 211, 212, 326; 430/138, 92, 43

[56] References Cited

U.S. PATENT DOCUMENTS

| | | | |
|---|---|---|---|
| 2,901,374 | 8/1959 | Gundlach | 355/217 X |
| 2,968,552 | 1/1961 | Gundlach | 355/210 X |
| 3,834,809 | 9/1974 | Yoshizawa et al. | 355/211 X |
| 3,924,945 | 12/1975 | Weigl | 355/271 X |
| 4,399,209 | 8/1983 | Sanders et al. | 430/138 |
| 4,483,912 | 11/1984 | Sanders | 430/138 |
| 4,545,669 | 10/1985 | Hays et al. | 355/212 X |
| 4,637,708 | 1/1987 | Yuasa | 355/212 |
| 4,694,310 | 9/1987 | Saito et al. | 355/242 X |
| 4,723,138 | 2/1988 | Hashimoto et al. | 355/271 |
| 4,825,256 | 4/1989 | Nakai et al. | 355/27 |
| 4,841,338 | 6/1989 | Suzuki | 355/27 |
| 4,842,976 | 6/1989 | Sanders et al. | 430/138 |
| 4,865,943 | 9/1989 | Wright | 430/138 |
| 4,985,727 | 1/1991 | Sakai et al. | 355/27 |
| 5,038,710 | 8/1991 | Kagayama et al. | 118/653 |
| 5,059,506 | 10/1991 | Mori et al. | 430/138 |
| 5,086,318 | 2/1992 | Takeda et al. | 355/271 |
| 5,097,286 | 3/1992 | Sakai | 355/27 |

FOREIGN PATENT DOCUMENTS

| | | | |
|---|---|---|---|
| 3036253 | 2/1988 | Japan | 430/138 |
| 0016560 | 1/1990 | Japan | 430/138 |

OTHER PUBLICATIONS

Research Disclosure, Disclosure No. 33073, "Method and Apparatus for Controlling Image Development in Microcapsule Imaging Media", pp. 786-790, Oct. 1991.

Primary Examiner—A. T. Grimley
Assistant Examiner—Matthew S. Smith
Attorney, Agent, or Firm—Oliff & Berridge

[57] ABSTRACT

An image forming apparatus makes use of a color developing principle in which there is an absorption or reaction between a color developer and a dye, pigment or dye precursor. A photosensitive member whose surface is rendered electrically conductive by application of light, and a photosensitive/pressure sensitive recording medium are exposed to image information containing light simultaneously so that the color developer is selectively deposited only onto portions of the photosensitive/pressure sensitive recording medium which is to develop color. Microcapsules containing the dyes, pigments or dye precursors located on the photosensitive/pressure sensitive recording medium are selectively broken according to the image information containing light, and the selectively deposited color developer transferred onto the photosensitive/pressure sensitive recording medium are transferred and fixed on any arbitrary medium to be recorded, thereby obtaining a desired image on the arbitrary medium.

31 Claims, 3 Drawing Sheets

IMAGE-FORMING SYSTEM

BACKGROUND OF THE INVENTION

1. Field of the Invention

This invention relates to image-forming systems of the type wherein images are recorded by selectively applying a color developer onto a photosensitive/pressure sensitive recording medium which contains photocurable microcapsules.

2. Description of the Related Art

As is known in the art, color developers usually include ultrafine particles dispersed in aqueous solvents. A color developer sheet is fabricated by adding properly controlled binders and additives to the color developer, and then applying the mixture to a paper sheet. An image-forming technique using this type of color developer sheet is disclosed, for example, in U.S. Pat. Nos. 4,399,209, 4,483,912, 4,842,976 and others. The terminology image-forming technique as used herein is intended to mean all image forming techniques wherein two or more ingredients which have been initially separated from each other are brought into contact and combined with each other by application of a physical external force such as pressure and/or temperature, so that an optical variation, a variation in optical absorption region, or an absorption intensity is caused to occur, thereby rendering visible information present in the ingredients.

For example, one of the conventional image-forming techniques uses photocurable microcapsules as described below. This technique uses three types of photocurable microcapsules which, respectively, contain yellow, magenta and cyan dye precursors, dyes or pigments. The respective photocurable microcapsules have the following characteristics. The photocurable microcapsules which contain a cyan precursor, dye or pigment are cured by exposure to red light having a wavelength of approximately 650 nm. The photocurable microcapsules containing a magenta dye precursor, dye or pigment are cured by exposure to green light having a wavelength of approximately 550 nm. The photocurable microcapsules containing a yellow dye precursor, dye or pigment are cured by exposure to blue light having a wavelength of approximately 450 nm.

In order to record images utilizing the abovedescribed characteristics of the photocurable microcapsules, a photosensitive/pressure sensitive recording medium having these photocurable microcapsules applied thereon is used with a medium on which the image is to be recorded (a recording medium), and which has a color developer pre-coated thereon.

The photosensitive/pressure sensitive recording medium comprises a support (such as, for example, a web) having a photocurable microcapsule layer formed thereon. The support can have the photocurable microcapsule layer formed thereon by uniformly applying the three types of photocurable microcapsules onto the support. The recording medium (i.e., the medium which is to ultimately receive the image) also comprises a support having a color developer layer (which reacts with the dye-precursors or absorbs the pigments or dyes) uniformly coated on the support. If a dye precursor is contained in the respective photocurable microcapsules, the color developer provided on the recording medium is able to develop a color by reacting with the dye precursor (which is usually colorless). This reaction occurs when the recording medium is contacted with the photosensitive/pressure sensitive recording medium, and pressure or heat is applied to the combined mediums resulting in breakage of the microcapsules. Alternatively, when the photocurable microcapsules contain a dye or pigment (instead of the dye-precursor), the color is developed by absorption of the dyes or pigments by a dye-receiving material (on the recording medium) after breakage of the photocurable microcapsules as described above.

When red, green and blue light rays are irradiated, according to an original image, on the photocurable microcapsule layer of the photosensitive/pressure sensitive recording medium (which can be done simultaneously or at separate times for each different color), only the photocurable microcapsules which have been exposed to light having the predetermined wavelengths described above are cured. (This curing results in a change of the viscosity of the contents of the microcapsules, which in the described examples is an increase in viscosity, resulting in hardening of the microcapsules. This phenomenon is well known in the art.) This eventually leads to formation of a chemical latent image (corresponding to the original image) being formed on the photocurable microcapsules located on the support. Subsequently, the photosensitive/pressure sensitive recording medium and the recording medium are superposed such that the photocurable microcapsule layer on which the chemical latent image has been formed and the coated layer of color developer are in face-to-face contact. The superposed mediums are then passed between a pair of pressure rollers and/or heated to break uncured microcapsules by pressure and/or heat. The contents of the broken microcapsules are transferred to the recording medium, thereby developing and recording a desired image on the recording medium.

Another technique which is similar to the image-forming technique described above is described below. In the above-described image-forming technique, images are formed on a recording medium on which a developer has been pre-coated. The technique to be described below enables images to be formed on any arbitrary type of recording medium. In this second technique, color developer powder is electrostatically applied onto an arbitrary medium (such as, for example, plain paper), thereby forming a recording medium. Then, the same procedures (superposing, etc.) as in the first described technique are performed.

This second type of technique is known as a color developer application technique, and is disclosed in U.S. Pat. No. 5,038,710. According to the color developer application technique, an electrode is placed on the back side of any arbitrary recording medium. An electric field is generated between the electrode and a carrier (for example, a photosensitive drum) which is used to carry the color developer powder, so that the color developer powder is then electrostatically attracted to the recording medium. This results in the color developer powder being applied onto the entire surface of the arbitrary recording medium.

The application of the color developer particles onto the entire surface of the recording medium as described above has the following problem. When an image is formed on the recording medium which has the color developer powder applied on the entire surface thereof, the developer powder remains on the white or background regions even though no color developing function is required for these background regions. In the described example, the regions which are free of any image correspond to the area of the recording medium which was superposed with regions of the photosensitive/pressure sensitive recording medium that contained all cured microcapsules, and thus no color. Thus, the developer powder located on the background regions is wasted, increasing a cost per unit output image (hard copy). Moreover, the color developer powder located on the white (background) regions becomes discolored by prolonged exposure to light or air. This discoloration of the developer lowers the image contrast and degrades the storage properties of the resulting output image.

To avoid this problem, there has been proposed, for example, in U.S. Pat. No. 4,985,727, a selective application process of a color developer wherein color developer particles are selectively applied only onto portions of the photosensitive/pressure sensitive recording medium where color images are to be formed. In this process, however, the step of curing microcapsules by exposure of the photosensitive/pressure sensitive recording medium to a light image and the step of selectively applying a color developer onto the uncured portions of the light exposed photosensitive/pressure sensitive medium are performed separately. Accordingly, it is very difficult to register the selectively applied color developer and the uncured microcapsules. If the color developer and the latent microcapsule image are not accurately registered, not only a portion of the color developer is wasted by not contributing to the color development process, but also a portion of the desired image (i.e., the uncured microcapsules that were not coated with developer) are not color developed. Thus, there arises the problem that the image is incomplete and unclear.

OBJECTS AND SUMMARY OF THE INVENTION

Accordingly, it is an object of the invention to provide an image-forming system wherein a color developer can be selectively applied only to portions of a recording medium on which images, including letters and characters (i.e., colored images) are to be formed, whereby waste of the color developer can be avoided.

It is another object of the invention to provide an image-forming system which forms images having improved durability.

In order to achieve the foregoing and other objects, and to overcome the shortcomings discussed above, according to the invention, an image-forming system comprises: a photosensitive/pressure sensitive recording medium which includes, on a support, a uniform layer of photocurable microcapsules containing a first color forming ingredient (e.g., dye precursors) charging means for uniformly charging said photosensitive/pressure sensitive recording medium to a predetermined polarity; a photosensitive member which has a superposed structure including a conductive layer connected to a direct current power source having said predetermined polarity and a photoconductive layer, said photoconductive layer being arranged in face-to-face relation with respect to the uniform coating of photocurable microcapsules on said photosensitive/pressure sensitive recording medium; developing means for charging a color developer, capable of combining (e.g, by reaction or absorption) with the first color forming ingredient in the microcapsules to develop desired colors, to a polarity opposite to the predetermined polarity, and for uniformly applying the color developer onto said photoconductive layer of said photosensitive member; and exposing means for irradiating image information-containing light simultaneously onto both the photoconductive layer and the uniform layer of photocurable microcapsules so that portions of the photoconductive layer exposed to white light become conductive so as to strongly attract the color developer applied thereon, and portions of the photoconductive layer exposed to colored light weakly attract the color developer applied thereto so that the weakly attracted color developer is transferred from said photoconductive member onto portions of said photosensitive/pressure sensitive recording medium exposed to colored light, while the strongly attracted color developer remains on said photosensitive member.

According to the image-forming system of the present invention, the photosensitive/pressure sensitive recording medium is uniformly charged to a predetermined polarity by the charging means. The developing means uniformly charges a color developer to a polarity opposite to the predetermined polarity and also uniformly applies the color developer onto the photoconductive layer of the photosensitive member. The system further comprises an exposing means by which light having image information is irradiated simultaneously onto the photoconductive layer of the photosensitive member and the photocurable microcapsule layer of the photosensitive/pressure sensitive recording medium. By this process, portions of the photoconductive layer irradiated with white light are rendered conductive and strongly attract the color developer thereto. Portions of the photoconductive layer irradiated with colored light are not rendered conductive, so that the color developer is transferred from the photoconductive layer to colored light-exposed portions of the photosensitive/pressure sensitive recording medium. In this manner, the color developer is selectively applied only onto portions of the photosensitive/pressure sensitive recording medium which contain microcapsules which are to be ruptured.

According to the invention, the photosensitive/pressure sensitive recording medium and the photosensitive member are exposed to light at the same time, so that the selective curing of the microcapsules and the selective charging of the photoconductive layer of the photosensitive member are effected simultaneously, preferably by the same rays of light. As a consequence of this light exposure, the color developer on the photosensitive member is selectively, strongly electrostatically attracted to portions of the photosensitive member which received white light so that the selectively attracted color developer is not deposited onto the microcapsules which also received the white light (and thus will not be subsequently ruptured). Thus, only the selected color developer which takes part in the color development with rupturable microcapsules is deposited onto the photosensitive/pressure sensitive recording medium. The color developer located on portions of the photosensitive member exposed to white light, which would not take part in the color development process is not deposited onto the photosensitive/pressure sensitive recording medium. Thus, discoloration does not take place and waste of the color developer can be eliminated.

The present invention can also be used to selectively apply conventional toner powder (or microcapsular toner powder) which forms images without combining with any other material onto a support such as, for example, plain paper.

BRIEF DESCRIPTION OF THE DRAWINGS

Preferred embodiments of the present invention will be described in detail with reference to the following drawings, in which like reference numerals designate like elements, and wherein.

DETAILED DESCRIPTION OF THE PREFERRED EMBODIMENTS

Embodiments of the present invention are described with reference to the accompanying drawings. Reference is first made to FIG. 2A which illustrates an arrangement of a photosensitive/pressure sensitive recording medium K used in the described embodiments of the invention.

Photosensitive/pressure sensitive recording medium K includes a substrate 31 made of a transparent plastic capable of transmitting at least visible light therethrough (for example, polyethylene terephthalate, polypropylene or the like) and a layer of photocurable microcapsules 32 uniformly coated on one side of plastic film substrate 31. Each microcapsule contains, for example, a dye precursor such as Crystal Violet lactone, 3-diethyl-amino-7-chlorofluoran or the like. The dye precursors are sensitive to three types of colors including yellow, magenta and cyan. Three types of microcapsules 32C, 32M and 32Y which respectively contain these dye precursors are uniformly coated on one side of plastic film substrate 31. Microcapsules 32 also contain or are made of a photocurable resin. The photocurable resin has a viscosity which changes (via curing) depending on the amount and color of light applied thereto, which leads to a variation in a mechanical strength (i.e., hardness) of the microcapsules 32.

The respective photocurable microcapsules can be cured in the following manner. The microcapsule 32C containing a cyan dye precursor is cured by exposure to red light having a wavelength of approximately 650 nm. The microcapsule 32M containing a magenta dye precursor is cured by exposure to green light having a wavelength of approximately 550 nm. The microcapsule 32Y containing a yellow dye precursor is cured by exposure to blue light having a wavelength of approximately 450 nm. These microcapsules and their use are well known in the art as illustrated by the above-referenced U.S. patents.

Figure 1:
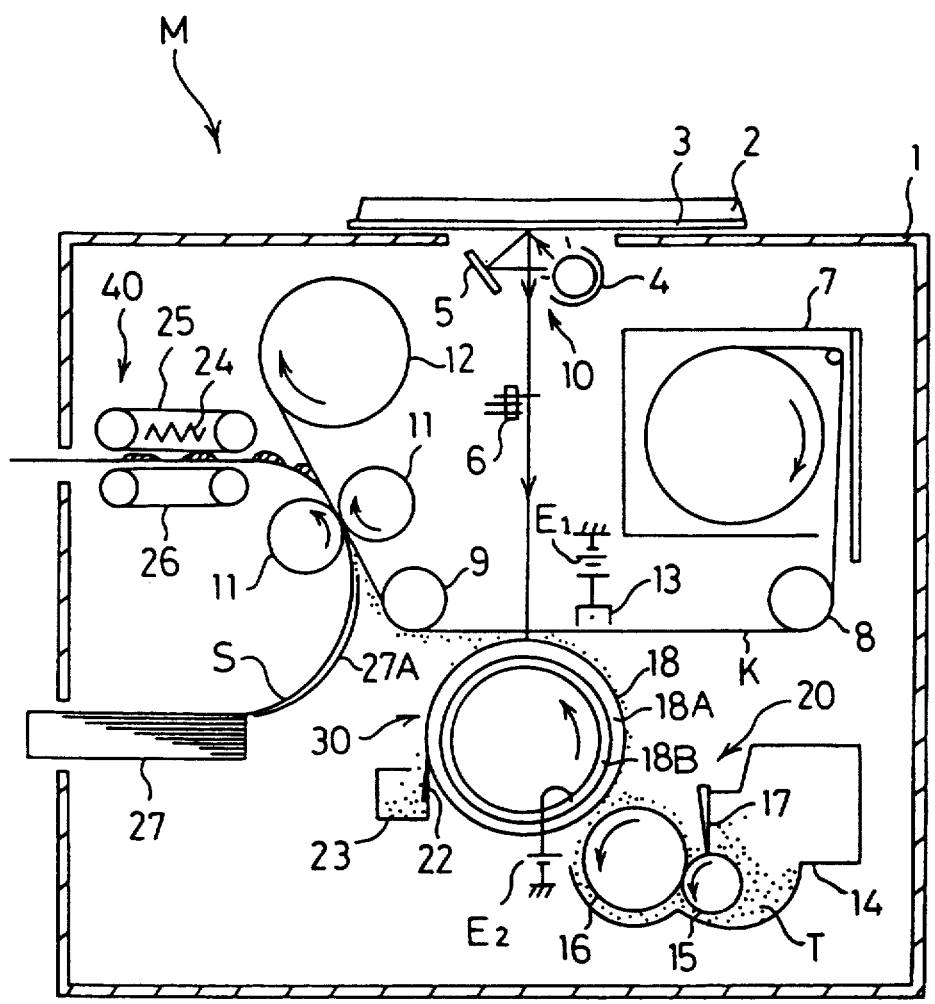
FIG. 1 is a schematic view of an image-forming system according to one preferred embodiment of the present invention.

Referring now to FIG. 1, the image-forming system according to the present invention is described.

An image-forming system M includes a housing 1 having an original mount 2 at the upper surface of housing and is arranged to hold an original 3 (the original document to be copied) below original mount 2. The original mount 2, while keeping the original 3 in position is movable in the left or right direction as viewed in FIG. 1 by conventional drive means (not shown). Generally, the image-forming system M accommodates therein an exposure unit 10, a developing unit 20, a transfer unit 30, and a thermal fixing unit 40.

The exposure unit 10 is located below the original mount 2 and includes a light source 4, a reflection mirror 5 and a filter unit 6. Light source 4 is, for example, a halogen lamp. The light emitted from light source 4 arrives directly, or after reflection by reflection mirror 5, at original 3 held by original mount 2. Reflection mirror 5 reflects part of the light emitted from light source 4, thereby permitting the reflected light to reach original 3. The light arriving at original 3 from light source 4 or reflection mirror 5 is reflected from the surface of original 3 and passed through filter unit 6.

Filter unit 6 includes three color filters (red, green and blue). When an operator actuates color-adjusting buttons (not shown), the degree of insertion of each filter into the light path is controlled. These filters are inserted into the light path by conventional drive means (not shown).

The reflected light from original 3 is selectively passed through the filters of filter unit 6 and arrives at the surface of photosensitive/pressure sensitive recording medium K and a photosensitive drum 18 described hereafter, both of which are located below exposure unit 10. Photosensitive/pressure sensitive recording medium K has an elongated strip shape (i.e., it is a web) and is wound and accommodated in a cartridge 7 which is located on the upper right side of housing 1. Photosensitive/pressure sensitive recording medium K is received on a takeup roller 12 through guide rollers 8, 9 and pressure rollers 11.

Developing unit 20 is located in the lower right side of housing 1 and is comprised of a toner case 14, a feed roller 15, a carrier roller 16 and a layer thickness regulating blade 17.

Toner case 14 contains therein a color developer T capable of reacting with the dye precursors contained in the respective types of microcapsules, thereby developing colors. Toner case 14 has an opening through which a portion of carrier roller 16 is exposed. Feed roller 15 is rotatably provided within toner case 14. When feed roller 15 is rotated in the direction indicated by the arrow thereon shown in FIG. 1, the surface of feed roller 15 is frictionally contacted with color developer T in toner case 14. As a result of this frictional contact, color developer T is negatively charged, for example. The negatively charged color developer T is deposited onto the surface of feed roller 15 in a conventional, well known manner. In order to avoid breakage of color developer T during the course of feeding, feed roller 15 should preferably be constructed from an elastic material such as polyurethane and sponge.

Layer thickness regulating blade 17 is fixedly located at the opening of toner case 14, and is arranged so that one end thereof is very closely spaced from the surface of feed roller 15. The material of which layer thickness regulating blade 17 is constructed is not critical so long as a certain degree of rigidity is provided. Preferably, the layer thickness regulating blade 17 should be made of a material which is harder than the material of the feed roller 15. The layer thickness regulating blade 17 functions to remove excess color developer T from feed roller 15, thereby providing a layer of the color developer T which is smooth and uniform in thickness.

Carrier roller 16 is rotatably provided within toner case 14. A portion of the carrier roller 16 is exposed through the opening of toner case 14. Carrier roller 16 may be conductive or insulative in nature (depending on the type of color developer material and the charging mechanisms relied upon, many of which are known in the art) and has a surface which is roughened in order to improve the feeding efficiency of color developer T. Carrier roller 16 is arranged so as to be rotated in the direction indicated by the arrow thereon in FIG. 1, while contacting with feed roller 15. Accordingly, color developer T which was previously deposited onto the surface of feed roller 15 is made constant in thickness by means of the layer thickness regulating blade 17, and is then contacted with the roughened surface of carrier roller 16. As a result, the color developer undergoes a further frictional contact, thereby ensuring a stronger negative charge thereof. The more strongly negatively charged color developer T is transferred from feed roller 15 to carrier roller 16. Carrier roller 16 is rotated in the direction indicated by the arrow in FIG. 1 by means of a drive source (not shown), so that color developer T received from feed roller 15 is carried to a position closely adjacent to photosensitive drum 18, described hereafter, by the rotation of carrier roller 16.

Transfer unit 30 is located substantially at the center of housing 1 and includes a charger 13, photosensitive drum 18, a color developer collection blade 22, and a color developer collection case 23.

Charger 13 includes a corotron or scorotron and is fixedly provided upstream of a portion of the photosensitive/pressure sensitive recording medium K which is exposed to the light reflected from original 3. Charger 13 is connected to a positive direct current power source E1 (e.g., +500 V) and is able to positively charge the photosensitive/pressure sensitive recording medium prior to exposure thereof.

Photosensitive drum 18 is rotatably provided to an upper left side of carrier roller 16 so that drum 18 is in face-to-face relation with the surface of a portion of carrier roller 16 which is exposed through the opening o toner case 14. Photosensitive drum 18 includes a photoconductive layer 18A and a conductive layer 18B. Conductive layer 18B is connected to a positive direct current power source E2 (e.g., +600 V). The absolute value of the direct current power source E1 is preferably lower than that of the direct current power source E2. This assists in maintaining selected developer particles on drum 18, to be described below. Photosensitive drum 18 is arranged so that the light reflected from the original through photosensitive/pressure sensitive recording medium K is also irradiated onto drum 18. Conductive layer 18B serves to weakly attract color developer T from carrier roller 16 onto the photoconductive layer 18A of photosensitive drum 18. Color developer collection blade 22 is provided downstream of the portion of photosensitive drum 18 which is exposed to light. Color developer collection blade 22 is contacted at one end thereof with the surface of photosensitive drum 18. When photosensitive drum 18 is rotated, color developer collection blade 22 thus removes color developer from photosensitive drum 18 which remained on drum 18 (instead of being transferred to photosensitive/pressure sensitive recording medium K).

Color developer collection case 23 surrounds color developer collection blade 22, and collects color developer T removed from the surface of photosensitive drum 18 by means of collection blade 22. Color developer collection case 23 is detachable. When case 23 is full of collected color developer T, case 23 is removed from housing 1 and color developer T therein is emptied from case 23. The emptied color developer collection case 23 is then mounted in housing The collected color developer T may be re-utilized.

On the left side of housing 1 is provided a cassette 27 in which sheets of recording medium S (such as ordinary paper sheets) are stacked. Cassette 27 is detachably mounted in housing 1. When images are recorded, the uppermost sheets to be recorded are supplied one by one by means of, for example, a suction feeding device (not shown), and are passed along a guide plate 27A to pressure rollers 11 described hereafter.

The pair of pressure rollers 11 are provided to press the photosensitive/pressure sensitive recording medium K and the recording medium S which have been provided superposed to rollers 11. By this pressing, uncured microcapsules 32 are broken and their contents are released therefrom. The contents combine with the color developer T, and thus color developer T develops the respective color images, which are transferred to recording medium S.

The thermal fixing unit includes belt assemblies 25, 26 for feeding sheets therethrough, and a heater 24. Means for feeding sheets through thermal fixing unit 40 other than belts 25, 26 could alternatively be provided. For example, rollers could be used to feed sheets. Belts 25, 26 may also apply pressure to the sheets.

Operation of the transfer unit 30 in this embodiment is described with reference to FIGS. 2A and 2B.

As shown in FIG. 2A, a positive potential of, for example, +500 V is passed from charger 13 to photosensitive/pressure sensitive recording medium K. The light reflected from original 3, i.e. the light having image information of original 3, is irradiated onto photosensitive/pressure sensitive recording medium K from the side of substrate 31. As set forth above, substrate 31 is transparent, and thus allows transmission of at least visible light therethrough, so that the light having image information irradiated onto substrate 31 is passed through substrate 31 and irradiated onto the microcapsules 32. By this light exposure, microcapsules 32 are selectively cured in a well-known manner according to the image information. In FIG. 2A, the downward pointing solid arrows represent white light and the downward pointing dashed arrows represent colored light (which includes black or no light) reflected from original 13. The light having image information from original 3 is passed through microcapsules 32 and color developer T (which are both transparent) and arrives at photoconductive layer 18A of photosensitive drum 18. Photoconductive layer 18A is rendered conductive at portions where irradiated with white light, resulting in the photoconductive layer becoming conductive so as to have the same potential as conductive layer 18B. In this embodiment, the potential of conductive layer 18B is +600 V. The portions of the photoconductive layer of photosensitive drum 18 whose potential is +600 V strongly attract color developer T1 which, as described above, is negatively charged. On the other hand, color developer T2 which is located on portions of photoconductive layer 18A which have not been irradiated sufficiently to become conductive (i.e., irradiated only with colored light) is only weakly attracted to conductive layer 18B of photosensitive drum 18 through photoconductive layer 18A (which is a conventional type of dielectric material). Accordingly, color developer T2 is attracted toward and transferred to photosensitive/pressure sensitive recording medium K (having a potential of +500 V).

FIG. 2B illustrates the state of photoconductive layer 18A corresponding to the respective light rays reflected from original 3 and the transfer of color developer T therefrom. As shown in FIG. 2B, photosensitive/pressure sensitive recording medium K is applied from the side of substrate 31 with a positive surface potential of +500 V by means of charger 13. The light having image information (which is the light reflected from original 3) reaches the photoconductive layer 18A of the photosensitive drum 18 through photosensitive/pressure sensitive recording medium K and the color developer T. Colored light rays including black light (BK), yellow light (Y), red light (R), magenta light (M), blue light (B), cyan light (C) and green light (G) (i.e., light other than white light (Wh)) do not have intensities sufficient to render photoconductive layer 18A conductive. On the other hand, white light (Wh) has an intensity sufficient to render photoconductive layer 18A conductive. Thus only the portion of photoconductive layer 18A irradiated with white light (Wh), as indicated by shading in FIG. 2b, is rendered conductive. Only this conductive portion has the same positive potential (+600 V) as conductive layer 18B. This potential (+600 V) is higher than the positive potential (+500 V) applied to photosensitive/pressure sensitive recording medium K by means of charger 13. Thus, color developer T located on the white-light exposed portion of drum 18 is not attracted toward photosensitive/pressure sensitive recording medium K.

The microcapsules in photosensitive/pressure sensitive recording medium K which have been irradiated with light rays other than white light are selectively cured according to their sensitivity to particular light intensities as described earlier. (Thus, some uncured microcapsules remain at the colored-light exposed portions of photosensitive/pressure sensitive recording medium K.) Color developer T is attracted and deposited only onto these selectively cured portions of medium K from photosensitive drum 18. Because color developer T is deposited only on the portions of photosensitive/pressure sensitive recording medium K which have been irradiated with light rays other than white light, no color developer T is deposited onto the portions of the photosensitive/pressure sensitive recording medium K which were exposed to white light.

The color developers T used in the described embodiment are mainly comprised of developer materials capable of color development by reaction with dye precursors. Examples include natural clay minerals such as acid clay, bentonite and attapulgite, organic acids and esters thereof such as tannic acid, garlic acid and propyl gallate, acidic polymers such as phenolic resins, maleic resins, phenol-acetylene resins and polycondensates of carboxylic acids having at least one hydroxyl group and formaldehyde, metal salts of aromatic carboxylic acids such as zinc salicylate, tin salicylate, zinc 2-hydroxynaphthoate, zinc 3,5-di-t-butylsalicylate and zinc 3,5-di-(α-methylbenzyl)salicylate, and metal salt-modified phenolic resins modified with polyvalent metals such as zinc and nickel.

Of these color developers, condensates of phenols and formaldehyde and metal salts of aromatic carboxylic acids such as salicylic acid are very effective for use as an ingredient of a color developer in order to render the developer photoconductive. Examples of condensates of phenols and formaldehyde include phenols such as p-phenylphenol, p-t-butylphenol, p-octylphenol, bisphenol and the like and formaldehyde. Examples of the metal salts of aromatic carboxylic acids such as salicylic acid include salts of metals such as magnesium, aluminum, calcium, manganese, iron, cobalt, nickel, copper, zinc, tin and the like, and aromatic carboxylic acids such as 3,5-dicyclohexylsalicylic acid, 3-cyclohexyl-5-phenylsalicylic acid, 3-cyclohexyl-5-benzylsalicyclic acid, 3-cyclohexyl-5-(α-methylbenzyl)salicylic acid, 3-(dicyclohexyl)salicylic acid, 3-(dicyclohexyl)-5-methylsalicyclic acid, 3-(dicyclohexyl)-5-ethylsalicylic acid, 3-(dicyclohexyl)-5-t-butylsalicylic acid, 3-phenyl-5-(α-methylbenzyl)salicylic acid, 3-phenyl-5-(α,α-dimethylbenzyl)salicylic acid, 3-(α-methylbenzyl)-5-cyclohexylsalicylic acid, 3,5-di(α- methylbenzyl)salicylic acid, 3-(α-methylbenzyl)-5-(α,α-dimethylbenzyl)salicylic acid, 3-(α,α-dimethylbenzyl)-5-cyclohexylsalicylic acid, 3-(α,α-dimethylbenzyl)-5-(α-methylbenzyl)salicylic acid, and 3,5-di-(α,α-dimethylbenzyl)salicylic acid.

If color developer T consists essentially of a color developer ingredient, the following problem will arise when color developer T is applied on photosensitive/pressure sensitive recording medium K and then fixed onto recording medium S by pressing. The color developer T is not reliably fixed on recording medium S, but remains on photosensitive/pressure sensitive recording medium K. This creates gaps in the image formed on recording medium S. To avoid this problem, it is known to mix the color developer with materials capable of deposition only on recording medium S in order to impart press fixing properties thereto. The press fixing properties of color developer T to recording medium S result from the interlocking or adhesiveness of the constituent ingredients. Accordingly, waxes and adhesives which have good miscibility with the color developer and good adhesiveness to recording material S are combined to improve the press fixing properties of color developer T.

Examples of the adhesives include ethylene-vinyl acetate copolymers, polyvinyl ethers, vinyl chloride-vinyl acetate copolymers, polyvinyl chloride, polyvinyl butyral and the like. Examples of waxes include carnauba wax, candelilla wax, rice wax, lanolin wax, Japan wax, bees wax, paraffin wax, microcrystalline wax, montanic acid wax, halogenated paraffin wax, amide wax, ozokerite wax, polyolefins such as polyethylene and polypropylene. These press fixing ingredients may be used singly or in combination. By adding these materials, there can be obtained a color developer which has good press fixing properties to recording medium S.

The color developer ingredient and the press fixing ingredient are kneaded under melting conditions and dispersed to obtain particles of the developer T having an average diameter of from 5 to 50 μm.

These color developers and photosensitive/pressure sensitive materials are well known and merely illustrative. Numerous other two ingredient type development systems could also be used with the present invention.

Light source 4 preferably should be a light source for providing light in the visible light region, which is capable of consistently reproducing a light image of original 3. Examples of light sources include halogen lamps, tungsten flood lamps, metal halide lamps, and laser and LED array devices capable of emitting visible light rays. Light source 4 should be one which is able to carry out exact color reproduction of an image of the original and to emit a quantity of light sufficient for complete curing of microcapsules 32 on photosensitive/pressure sensitive recording medium K.

Figure 2:
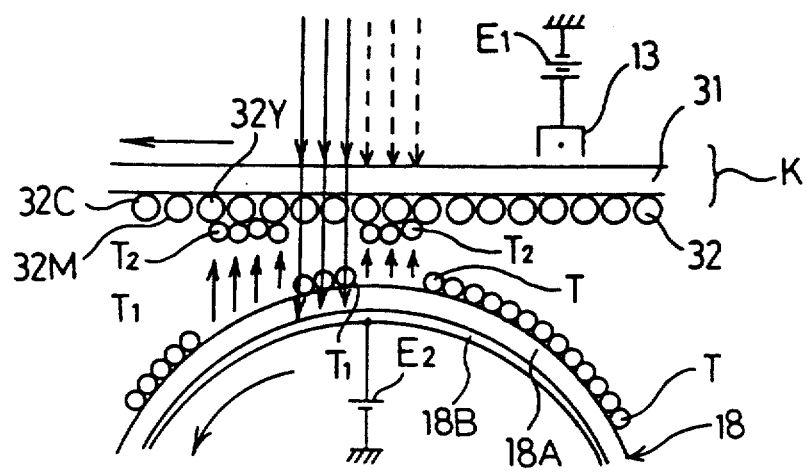
FIG. 2A is a schematic view illustrating the operating principle of an exposing unit used in the preferred embodiment of the present invention.
FIG. 2B is a schematic view illustrating light intensities of the respective reflected light rays and a conduction state of a photoconductive layer when exposed to the respective light rays.
Figure 2:
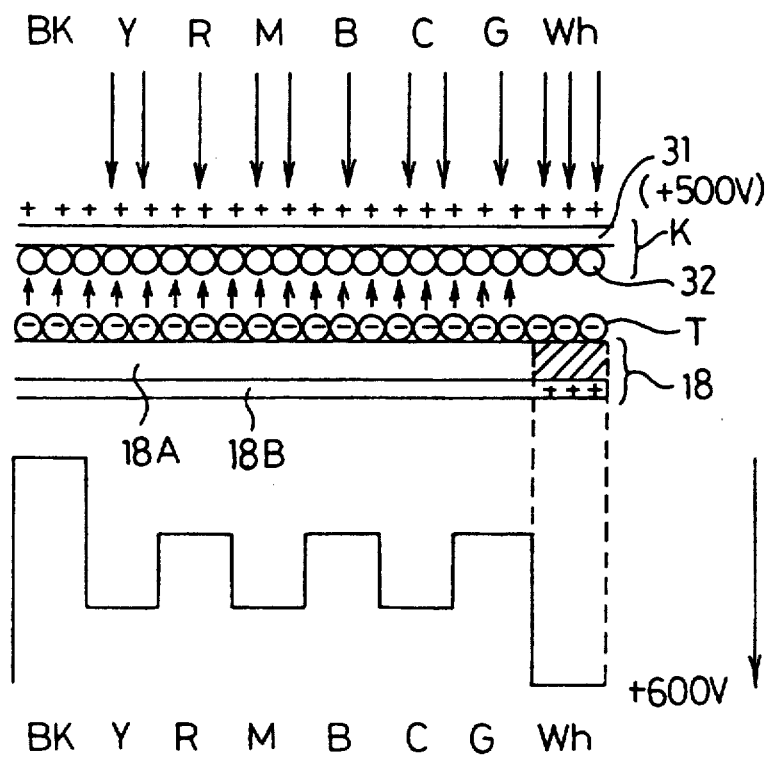
Figure 3:
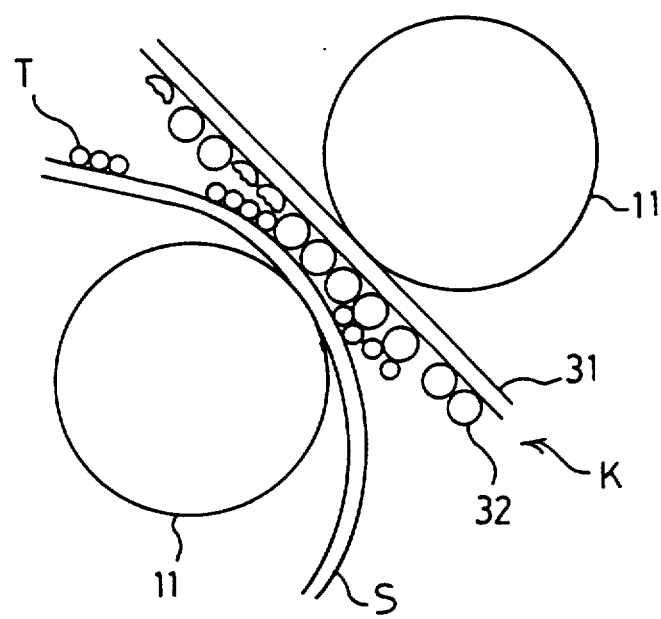
FIG. 3 is a schematic view illustrating color development through breakage of microcapsules and combination with color developer particles, and the transfer of the combined materials onto an arbitrary recording medium.

The operation of the image-forming system in the illustrated embodiment is described with reference to FIGS. 1 to 3.

Initially, a user places the original 3 on original mount 2 in such a way that the image-bearing surface of original 3 faces down. When the user pushes a start button (not shown), light source 4 irradiates the image-bearing surface of original 3. Original mount 2 can be moved to the left or right direction, as viewed in FIG. 1, while keeping the original in position thereon. The reflected light from original 3 is selectively passed through the filters of filter unit 6 and reaches photosensitive/pressure sensitive recording medium K. In the meantime, photosensitive/pressure sensitive recording medium K supplied from cartridge 7 is transferred by means of the rollers 8, 9 and the takeup roller 12, preferably at the same speed at which original mount 2 is moved.

A surface potential of +500 V is applied to photosensitive/pressure sensitive recording medium K by charger 13. The light arriving at photosensitive/pressure sensitive recording medium K is passed through medium K and color developer T (electrostatically held on drum 18) and reaches the surface of photosensitive drum 18. Because the light from the irradiation of original 3 is a light ray having a predetermined width, the same predetermined width of photosensitive/pressure sensitive recording medium K is also exposed with these light rays in synchronism with the movement of original 3 in the horizontal direction, as viewed in the figure, while being kept on original mount 2. The light having image information reflected from original 3, is passed from the transparent substrate side 31 of medium K to selectively cure microcapsules 32, followed by further passage through color developer T until it reaches photosensitive drum 18. The color developer T is frictionally, negatively charged in developer unit 20 and is uniformly deposited on carrier roller 16 by means of layer thickness regulating blade 17 and feed roller 15. By regulating the amount of color developer which is deposited on carrier roller 16, an amount of color developer T which is deposited on and transferred to photosensitive drum 18 is properly limited. The negatively charged color developer T carried on carrier roller 16 is transferred to the photosensitive drum 18 because conductive layer 18B (having a positive potential of +600 V), provided on drum 18 beneath photoconductive layer 18A weakly attracts toner particles T from carrier 16. The uniformly applied color developer T on photosensitive drum 18 is transferred to photosensitive/pressure sensitive recording medium K according to the image information at a transfer position (illustrated in FIG. 2A) where photosensitive/pressure sensitive recording medium K and photosensitive drum 18 come closest to each other.

The color developer remaining on photosensitive drum 18 (corresponding to white background portions of the image) is scraped from photosensitive drum 18 by toner collection blade 22, and received in toner collection case 23.

Color developer T deposited on photosensitive/pressure sensitive recording medium K is then pressed by means of the pressure rollers 11 after superposition with recording medium S and is transferred and fixed onto recording medium S in a conventional manner. While the microcapsules 32 cured by the irradiation of white light are not ruptured by pressure rollers 11, microcapsules 32 which have been irradiated with colored light are ruptured by pressure rollers 11, so that, for example, the dye precursor contained therein is released. The released dye precursor is contacted with color developer T electrostatically deposited onto photosensitive/pressure sensitive recording medium K, thereby developing colors.

The transfer rate of the color developer T to the recording medium S depends greatly on the surface wettabilities of photosensitive/pressure sensitive recording medium K coated with color developer T, and recording medium S. Depending on the properties of the fixing component, a transfer rate of 100% may be achieved. The image formed on recording medium S is strongly fixed when heated to a temperature of from 120° to 180° C. by means of the thermal fixing unit 40, thereby obtaining an image output having a glossy surface.

With the thus obtained image, the portions where the microcapsules 32 are not broken, i.e., the white portions, do not have any color developer T deposited thereon. Therefore, little optical degradation occurs and discoloration is reduced, thereby ensuring a clear image.

In the embodiment set forth above, although the photosensitive/pressure sensitive recording medium K is positively charged and the color developer T is negatively charged, these polarities may be reversed.

In addition, although the image information containing light is applied from the side of photosensitive/pressure sensitive recording medium K in the above embodiment, the light alternatively may be applied from the side of photosensitive drum 18, provided that drum 18 is made of a transparent material. This can be done, as described in related U.S. patent application Ser. No. 07/780,239 to Yoshiyasu Honma et al., filed Oct. 22, 1991 and entitled "Image Recording Apparatus Provided With A Selective Powder Applying Device", by making the conductive layer from, for example, indium tin oxide or tin dioxide, and the photoconductive layer from a transparent organic photoconductive material. The disclosure of U.S. patent application Ser. No. 07/780,239 is incorporated herein by reference.

Additionally, the image information containing light can also be split and separately (but still simultaneously) applied to photosensitive/pressure sensitive material K (from the side of substrate 31) and photosensitive drum 18 (from the inside of drum 18) using a beam splitting arrangement as illustrated in the above-incorporated U.S. patent application Ser. No. 07/780,239. This is especially useful if the developer particles are not sufficiently transparent to allow image information containing light to reach photoconductive layer 18 by passing therethrough.

Although photocurable microcapsules containing a dye-precursor which reacts with a developer to form images mainly have been described, it is understood that the present invention is also applicable to photocurable microcapsules containing a dye or pigment which is absorbed by a color developer, which acts as a dye (or pigment)-receiving material. Thus, as used herein, a first type of developer combines with a dye-precursor by reacting with the dye-precursor to develop an image, while a second type of developer combines with a dye or pigment by absorbing the dye or pigment to develop an image. The dye-precursors can be colorless. Although microcapsules containing dyes or pigments are not colorless, they are sufficiently transparent to permit light to pass therethrough. The dye-precursors, dyes and pigments are generally referred to as a first color forming ingredient, while the developer is considered to be a second colorforming ingredient capable of combining with the first color forming ingredient to develop an image.

The present invention can also be used to selectively apply a powder, such as conventional toners or microcapsule tones onto a substrate. In this embodiment, the toner does not combine with any other materials. The toner is ultimately fused to a recording medium (e.g., plain paper) by heat and/or pressure. For example, the substrate upon which the toner is selectively applied could be transparent substrate 31 without the layer of microcapsules thereon. The toner would then be transferred from substrate 31 to the recording medium by superposing the substrate with the recording medium and using a corotron to transfer the toner to the recording medium as is well known in the art. Alternatively, the substrate upon which the toner is selectively applied from drum 18 could be the plain paper recording medium. Although the substrate does not have to be transparent (if the image information containing light is supplied from the inside of drum 18), the substrate still must be charged, preferably to a voltage level having an absolute value less than the absolute value of the voltage level applied to drum 18.

While this invention has been described in conjunction with specific embodiments thereof, it is evident that many alternatives, modifications and variations will be apparent to those skilled in the art. Accordingly, the preferred embodiments of the invention as set forth herein are intended to be illustrative, not limiting. Various changes may be made without departing from the spirit and scope of the invention as defined in the following claims.

What is claimed is:

1. An image-forming system, comprising:
   a photosensitive/pressure sensitive recording medium which includes a support and a uniform layer of photocurable microcapsules containing a first color forming ingredient on the support;
   charging means for uniformly charging said photosensitive/pressure sensitive recording medium to a predetermined polarity;
   a photosensitive member having a conductive layer and a photoconductive layer arranged in a superposed manner, said conductive layer being coupled to a first direct current power source having said predetermined polarity, said photoconductive layer being located on an outermost surface of said photosensitive member so as to be arranged in face-to-face relation with respect to the uniform layer of said photocurable microcapsules on said photosensitive/pressure sensitive recording medium;
   developing means for charging a developer which is capable of combining with the first color forming ingredient to develop an image, to a polarity opposite to said predetermined polarity and for uniformly applying the charged developer onto the photoconductive layer; and
   exposing means for simultaneously irradiating an image information containing light on both the photoconductive layer and the uniform coating of the photocurable microcapsules.

2. The image-forming system according to claim 1, wherein said photosensitive/pressure sensitive recording medium is an elongated web.

3. The image-forming system according to claim 1, wherein said charging means includes a second direct current power source which charges said photosensitive/pressure sensitive recording medium to said predetermined polarity.

4. The image-forming system according to claim 3, wherein an absolute value of a second voltage supplied by said second direct current power source is lower than an absolute value of a first voltage supplied by said first direct current power source.

5. The image-forming system according to claim 1, wherein said photosensitive member comprises a photosensitive drum, said photoconductive layer is provided on an outer peripheral surface of said photosensitive drum, and said conductive layer is provided radially inwardly from said photoconductive layer of said photosensitive drum.

6. The image-forming system according to claim 5, wherein the support of said photosensitive/pressure sensitive recording medium is transparent and capable of transmitting at least visible light therethrough.

7. The image-forming system according to claim 6, wherein said image information containing light is irradiated on the photocurable microcapsules after being transmitted through the support, and said photoconductive layer is irradiated with said image information containing light after said image information containing light has been transmitted through the support.

8. The image-forming system according to claim 7, wherein said charging means charges said photosensitive/pressure sensitive recording medium before said exposing means irradiates image information containing light onto both said photoconductive layer and said photocurable microcapsules.

9. The image-forming system according to claim 1, wherein said first color forming ingredient includes dye-precursors, and said developer is capable of reacting with said dye-precursors to develop colors.

10. An image-forming system, comprising:
    a photosensitive/pressure sensitive recording medium which includes a support and a uniform layer of photocurable microcapsules containing a first color forming ingredient on the support, said photosensitive/pressure sensitive recording medium being provided as an elongated web;
    charging means for uniformly charging said photosensitive/pressure sensitive recording medium to a predetermined polarity;
    a photosensitive member having a conductive layer and a photoconductive layer arranged in a superposed manner, said conductive layer being coupled to a first direct current power source having said predetermined polarity, said photoconductive layer being located on an outermost surface of said photosensitive member so as to be arranged in face-to-face relation with respect to the uniform layer of said photocurable microcapsules;
    developing means for charging a developer, which is capable of combining with the first color forming ingredient to develop colors, to a polarity opposite to said predetermined polarity and for uniformly applying the developer onto the photoconductive layer;

irradiating means for simultaneously irradiating an image information containing light on both the photoconductive layer and the uniform coating of the photocurable microcapsule;

supplying means for storing and supplying a recording medium on which an image is to be recorded;

pressure means for applying pressure to the recording medium and said photosensitive/pressure sensitive recording medium when arranged in a superposed manner to rupture uncured microcapsules; and thermal fixing means for heating and fixing an image on said recording medium.

11. The image-forming system according to claim 10, wherein said charging means includes a second direct current power source which charges said photosensitive/pressure sensitive recording medium to said predetermined polarity.

12. The image-forming system according to claim 11, wherein an absolute value of a second voltage supplied by said second direct current power source is lower than an absolute value of a first voltage supplied by said first direct current power source.

13. The image-forming system according to claim 10, wherein said photosensitive member comprises a photosensitive drum, said photoconductive layer being provided on an outer peripheral surface of said photosensitive drum and said conductive layer being provided radially inwardly of said photoconductive layer of said photosensitive drum.

14. The image-forming system according to claim 13, wherein the support of said photosensitive/pressure sensitive recording medium is transparent and capable of transmitting at least visible light therethrough.

15. The image-forming system according to claim 14, wherein said image information containing light is irradiated onto the photocurable microcapsules after passing through the support, said light which passes through said support also being irradiated onto said photoconductive layer.

16. The image-forming system according to claim 15, wherein said charging means charges said photosensitive/pressure sensitive recording medium before said exposing means irradiates said image information containing light on both said photoconductive layer and said photocurable microcapsules.

17. The image-forming system according to claim 10, wherein said pressure means comprises a pair of pressure rollers.

18. The image-forming system according to claim 10, wherein said first color forming ingredient includes dye-precursors, and said developer is capable of reacting with said dye-precursors to develop colors.

19. An image-forming system, comprising:

a photosensitive member having a conductive layer and a photoconductive layer arranged in a superposed manner, said conductive layer being coupled to a first charging means for charging said conductive layer to a first voltage level having a predetermined polarity, said photoconductive layer being located on an outermost surface of said photosensitive member;

second charging means for uniformly charging a substrate to a second voltage level having said predetermined polarity, an absolute value of said second voltage level being less than an absolute value of said first voltage level;

particle applying means for uniformly applying particles charged to a polarity opposite from said predetermined polarity onto said photoconductive layer; and exposing means for irradiating an image information containing light onto said photoconductive layer after said charged particles have been uniformly applied onto said photoconductive layer so that selected portions of said photoconductive layer become conductive to have a voltage level substantially equal to a voltage level supplied by said first charging means, said particles being attracted to said selected conductive portions of said photoconductive layer more strongly than to non-conductive portions of said photoconductive layer.

20. The image-forming system according to claim 19, wherein said first charging means includes a first direct current power source which charges said conductive layer to said predetermined polarity, and said second charging means includes a second direct current power source which charges the substrate to said predetermined polarity.

21. The image-forming system according to claim 19, wherein said photosensitive member comprises a photosensitive drum, said photoconductive layer is provided on an outer peripheral surface of said photosensitive drum, and said conductive layer is provided radially inwardly from said photoconductive layer of said photosensitive drum.

22. The image-forming system according to claim 19, further comprising:

a substrate to which said particles located on said non-conductive portions of said photoconductive layer are transferred.

23. The image-forming system according to claim 22, wherein said substrate is transparent.

24. The image-forming system according to claim 22, further comprising:

supplying means for storing and supplying a recording medium on which an image is to be recorded;

pressure means for applying pressure to the recording medium and said selectively toner-applied substrate when arranged in a superposed manner; and thermal fixing means for heating and fixing an image on said recording medium.

25. An image-forming system, comprising:

charging means for uniformly charging a substrate to a predetermined polarity;

a photosensitive member having a conductive layer and a photoconductive layer arranged in a superposed manner, said conductive layer being coupled to a first direct current power source having said predetermined polarity, said photoconductive layer being located on an outermost surface of said photosensitive member;

particle applying means for uniformly applying particles charged to a polarity opposite from said predetermined polarity onto said photoconductive layer, so that said particles uniformly coat and are weakly adhered to said photoconductive layer;

exposing means for irradiating an image information containing light onto said photoconductive layer after said charged particles have been uniformly coated onto and weakly adhered to said photoconductive layer so that selected portions of said photoconductive layer become conductive to have a voltage level substantially equal to a voltage level supplied by said first direct current power source, said particles being attracted to said selected conductive portions of said photoconductive layer more strongly than to non-conductive portions of said photoconductive layer, said particles remaining weakly adhered to said non-conductive portions of said photoconductive layer; and a transfer point where the particles weakly adhered to the non-conductive portions of said photoconductive layer are transferred to a substrate charged by said charging means to said predetermined polarity.

26. The image-forming system according to claim 25, wherein said charging means includes a second direct current power source which charges the substrate to said predetermined polarity.

27. The image-forming system according to claim 26, wherein an absolute value of a second voltage supplied by said second direct current power source is lower than an absolute value of a first voltage supplied by said first direct current power source.

28. The image-forming system according to claim 25, wherein said photosensitive member comprises a photosensitive drum, said photoconductive layer is provided on an outer peripheral surface of said photosensitive drum, and said conductive layer is provided radially inwardly from said photoconductive layer of said photosensitive drum.

29. The image-forming system according to claim 25, further comprising:

a substrate to which said particles located on said non-conductive portions of said photoconductive layer are transferred.

30. The image-forming system according to claim 29, wherein said substrate is transparent.

31. The image-forming system according to claim 29, further comprising:

supplying means for storing and supplying a recording medium on which an image is to be recorded;

pressure means for applying pressure to the recording medium and said selectively toner-applied substrate when arranged in a superposed manner; an thermal fixing means for heating and fixing an image on said recording medium.

* * * * *